(12) United States Patent
Raidl et al.

(10) Patent No.: US 7,911,181 B2
(45) Date of Patent: Mar. 22, 2011

(54) AUTO-AVERAGING RC TIME CONSTANT CALIBRATION

(75) Inventors: Alfred Raidl, Rosenau (AT); Josef Hoeftberger, Geboltskirchen (AT); Bernhard Heigelmayer, Linz (AT)

(73) Assignee: Infineon Technologies AG, Neubiberg (DE)

( * ) Notice: Subject to any disclaimer, the term of this patent is extended or adjusted under 35 U.S.C. 154(b) by 751 days.

(21) Appl. No.: 11/949,516

(22) Filed: Dec. 3, 2007

(65) Prior Publication Data

US 2009/0140701 A1    Jun. 4, 2009

(51) Int. Cl.
*H01M 10/46* (2006.01)
(52) U.S. Cl. ........................................ 320/132
(58) Field of Classification Search .................. 320/107, 320/114, 127, 130, 132, 166; 324/76, 11, 324/130
See application file for complete search history.

(56) References Cited

U.S. PATENT DOCUMENTS

| 4,157,481 A * | 6/1979 | Walton ........................... 307/117 |
| 4,433,278 A * | 2/1984 | Lowndes et al. .............. 320/116 |
| 6,470,283 B1 * | 10/2002 | Edel ............................... 702/64 |
| 2006/0071639 A1 * | 4/2006 | Ross et al. ..................... 320/116 |

FOREIGN PATENT DOCUMENTS

DE    102008059791    *  7/2009
* cited by examiner

*Primary Examiner* — Edward Tso
(74) *Attorney, Agent, or Firm* — Lee & Hayes, PLLC

(57) ABSTRACT

This disclosure relates to auto-averaging RC time constant calibration are described. An auto-averaging calibration circuit includes two capacitor branches, where capacitors in the capacitor branches, charge and discharge alternately to accommodate multiple charging cycles in one measurement cycle for measuring a RC time constant. A value of RC time constant is obtained in each charging cycle. A final value of the RC time constant can be determined by averaging various values of the time constants obtained during each charging cycle.

20 Claims, 6 Drawing Sheets

AUTO-AVERAGING RC TIME CONSTANT CALIBRATION

BACKGROUND

Generally, integrated circuits (IC) in semiconductor chips include both active components such as operational amplifiers, and passive components such as resistors (i.e., R components) and capacitors (i.e., C components). Passive components (i.e., resistors and capacitors) typically have relatively large process (i.e., fabrication) variations with changes in the operational parameters of a device. For example, an analog RC low-pass filter circuit (IC) may be implemented using a typical submicron CMOS process, and may exhibit large variations in cutoff frequency behavior.

To compensate for the process variations in passive components (i.e., resistors and capacitors), adjustments may be made in the fabricated chip, such as with electric fuses, laser trimming, or other techniques; however, these adjustments can be relatively costly. A lower cost alternative is to use a dedicated calibration circuit together with the RC circuit (e.g., a RC low-pass filter circuit) to reduce the process variations in the RC circuit, by tuning the measured RC time constant of the calibration circuit and thus the cutoff frequency of the RC circuit close to a given target value.

BRIEF DESCRIPTION OF THE DRAWINGS

The detailed description is described with reference to the accompanying figures. In the figures, the left-most digit(s) of a reference number identifies the figure in which the reference number first appears. The same numbers are used throughout the drawings to reference like features and components.

DETAILED DESCRIPTION

This disclosure describes a technique for calibrating electronic circuits or integrated circuits (ICs). In particular, passive components of an IC are tuned for a particular cut-off frequency range. The disclosed technique uses an auto-averaging RC time constant calibration circuit that tunes or adjusts a circuit (e.g., IC) having passive components (e.g., resistors and capacitors).

Figure 1:
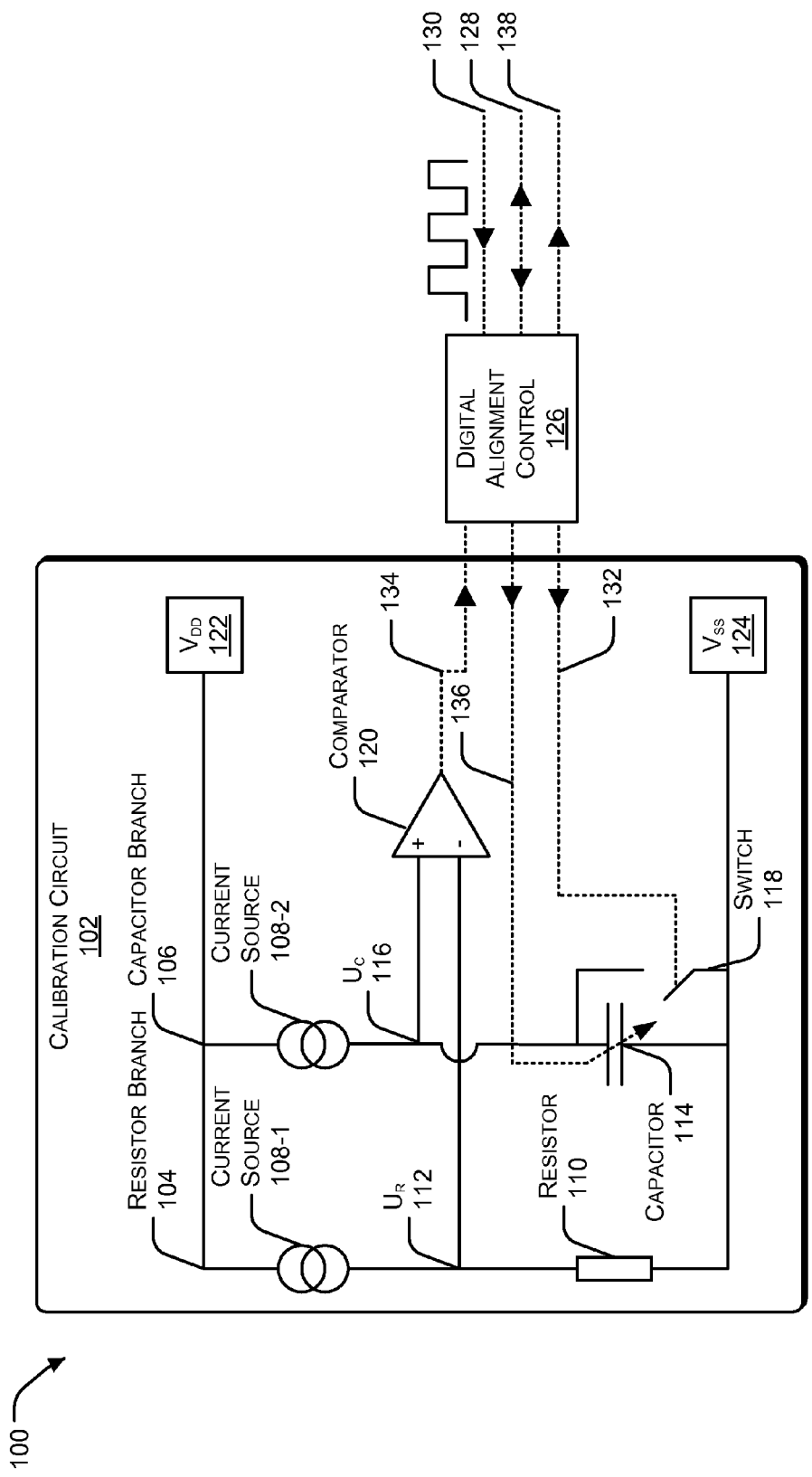
FIG. 1 is a block diagram illustrating an RC time constant calibration circuit.

FIG. 1 shows a system 100 for RC time constant calibration. The system 100 is particularly implemented with an RC circuit to tune the RC circuit to given cutoff frequency. The calibration circuit 102 determines a RC time constant by measuring the duration of a capacitor charging process. With the use of an algorithm, a capacitor tuning value is acquired which best fits the measured time interval for a given reference interval.

The calibration circuit 102 includes a resistor branch 104 and a capacitor branch 106. The resistor branch 104 includes a current source 108-1 and a resistor 110. The voltage across the resistor 110 is fixed at a pre-determined reference value $U_R$ 112. The capacitor branch 106 includes a current source 108-2 and a tunable capacitor 114. The voltage across the capacitor 114 is $U_C$ 116. The capacitor branch 106 also includes a switch 118. A comparator 120 is fed with the voltage $U_R$ 112 at its negative input and the voltage $U_C$ 116 at its positive input. Voltages $V_{DD}$ 122 and $V_{SS}$ 124 are the supply voltages provided to the circuit 102. A digital alignment control 126, which typically is part of an apparatus that includes the system 100, exchanges control signals with the capacitor 114, the switch 118, and the comparator 120. The digital alignment control 126 communicates with other connected components with the help of a bidirectional start/stop control signal 128. The digital alignment control 126 may receive a reference clock signal 130 from an oscillator.

The switch 118 is a discharge switch, which can be controlled by a discharge signal 132 from the digital alignment control 126. When the switch 118 is closed, the capacitor voltage $U_C$ 116 drops to or is maintained at zero volts. The charging of the capacitor 114 starts when the switch 118 opens and a constant current from the current source 108-2 is supplied to the capacitor 114 causing the voltage $U_C$ 116 to increase linearly with time. When the voltage $U_C$ 116 reaches a threshold value $U_R$ 112, set by the current source 108-1 and the effective value of resistor 110, the comparator 120 sends a comparator signal 134 to the digital alignment control 126. The time interval between the opening of the switch 118 and the comparator signal 134 is determined with the use of the reference clock signal 130. The capacitor 114 is tuned to different values by a tuning signal 136, provided by the digital alignment control 126, and a tuning value is finally selected for which the measured time interval equals a desired target value. A filter tuning signal 138 obtained from the digital alignment control 126 is used to tune components in the RC circuit using the calibration circuit 102.

Figure 2:
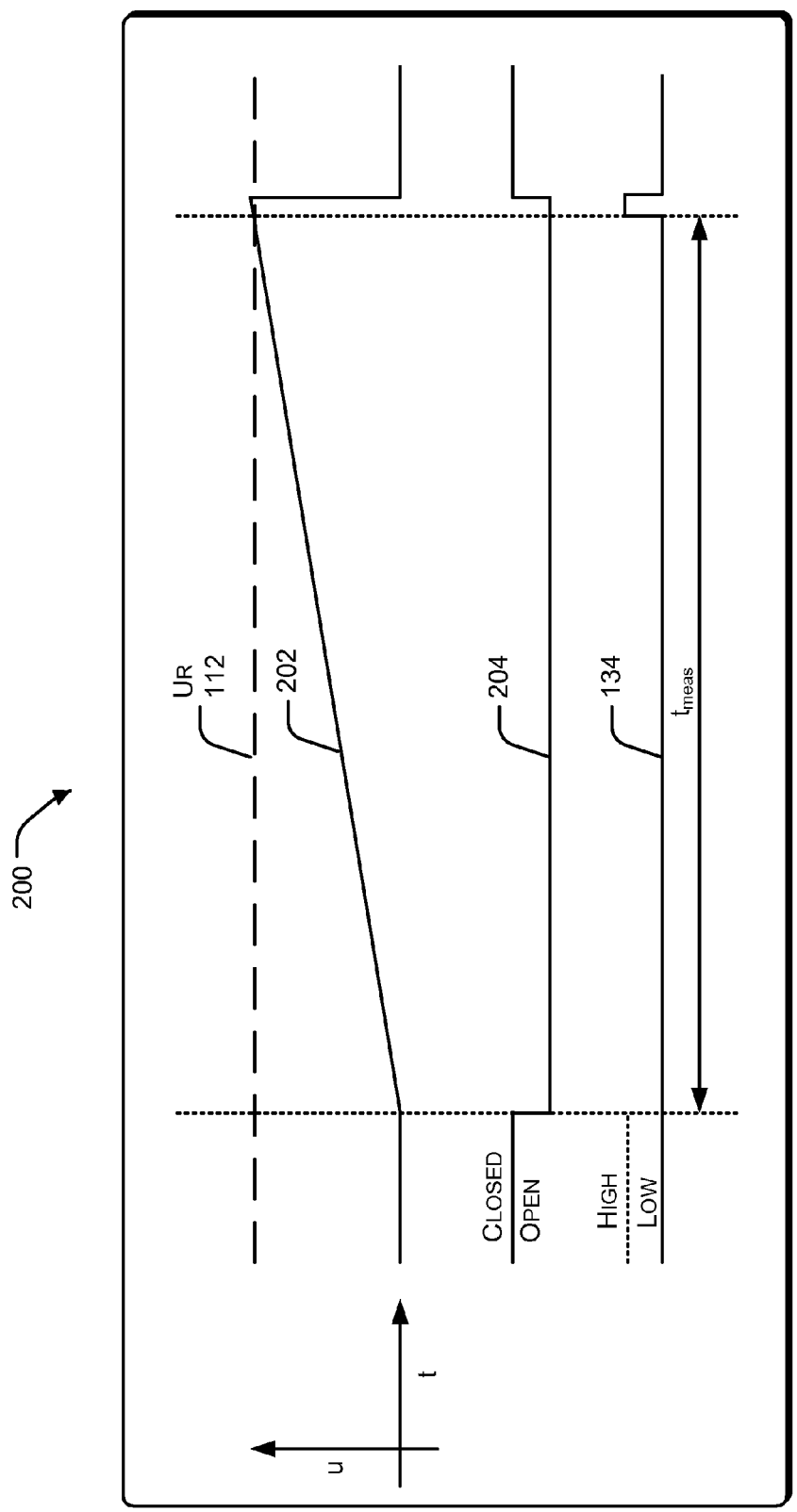
FIG. 2 is a chart illustrating a timing diagram for an RC time constant calibration circuit.

FIG. 2 illustrates a timing diagram 200 for the system 100. In the timing diagram 200, the voltage $U_R$ 112 is represented by a straight line and is set at a constant pre-determined value. Line 202 represents the varying capacitor voltage $U_C$ 116. The line 204 represents the state of the switch 118. The timing diagram 200 also represents the state of the comparator signal 134. Initially, when the switch 118 is closed, the capacitor voltage $U_C$ 116 is zero. When the switch 118 opens, the capacitor 114 begins charging and the capacitor voltage $U_C$ 116 starts increasing linearly with time. When $U_C$ 116 becomes equal to the reference voltage $U_R$ 112, the comparator signal 134 goes high. After this point, the switch 118 closes, discharging the capacitor 114 and eventually making the capacitor voltage $U_C$ 116 zero. The time elapsed between opening the switch 118 and receiving a high value of the comparator signal 134 is measured.

The rate of charging, or dU/dt, of the capacitor 114 is upper limited by the reference clock frequency and the available supply voltage. To achieve a sufficient temporal resolution, a charging time duration equivalent to at least 100 reference clock cycles is used; taking into account a very low supply voltage and a given charging current per unit capacitor, this sets a limit for dU/dt. However, even with a charging current per unit capacitor in the 1 µA range, the charging process is usually too fast for 100 cycles of a commonly available reference clock frequency, such as 19.2 MHz. In addition, the charging current per unit capacitor can also be limited by leakage currents of MOS switches inside the tunable capacitor. The calibration circuit 102 of the system 100 may be susceptible to noise and non-suppressed hum at the reference voltage $U_R$ 112 at the moment the comparator 120 is switching.

In a disclosed calibration circuit, the RC time constant is determined using two capacitors that are alternatively charged and discharged. The number of charging cycles can be pre-defined and any number of charging cycles can be included in one measurement cycle for determining the RC time constant. The capacitors are tunable, and can be tuned to a suitable value corresponding to a given target frequency value. By averaging the results obtained from the pre-defined charging cycles, a final time constant can be determined. Then, the capacitor(s) in the analog circuit (i.e., the IC) to be adjusted or calibrated, can also be tuned to the particular tuning value obtained, thus providing a RC time constant corresponding to the desired cut-off frequency. The auto-averaging RC time constant calibration circuit employs two capacitor branches instead of one, which allows the use of capacitors having values in the sub-pF (sub-picofarad) range.

The commutation of charging between two equal capacitor branches increases the rate of charging, or dU/dt, of the charging process. The total measurement time interval, even with a low supply voltage, is thus large enough to fit in a targeted range of hundreds of reference clock cycles and the proposed technique becomes applicable for relatively small capacitances, such as capacitances in the sub-pF range. The auto-averaging property of the proposed calibration circuit provides higher accuracy in measuring the time constant. The increased accuracy in the time measurement is obtained since the proposed method includes multiple consecutive charging cycles instead of just one per measurement cycle.

Exemplary System

Figure 3:
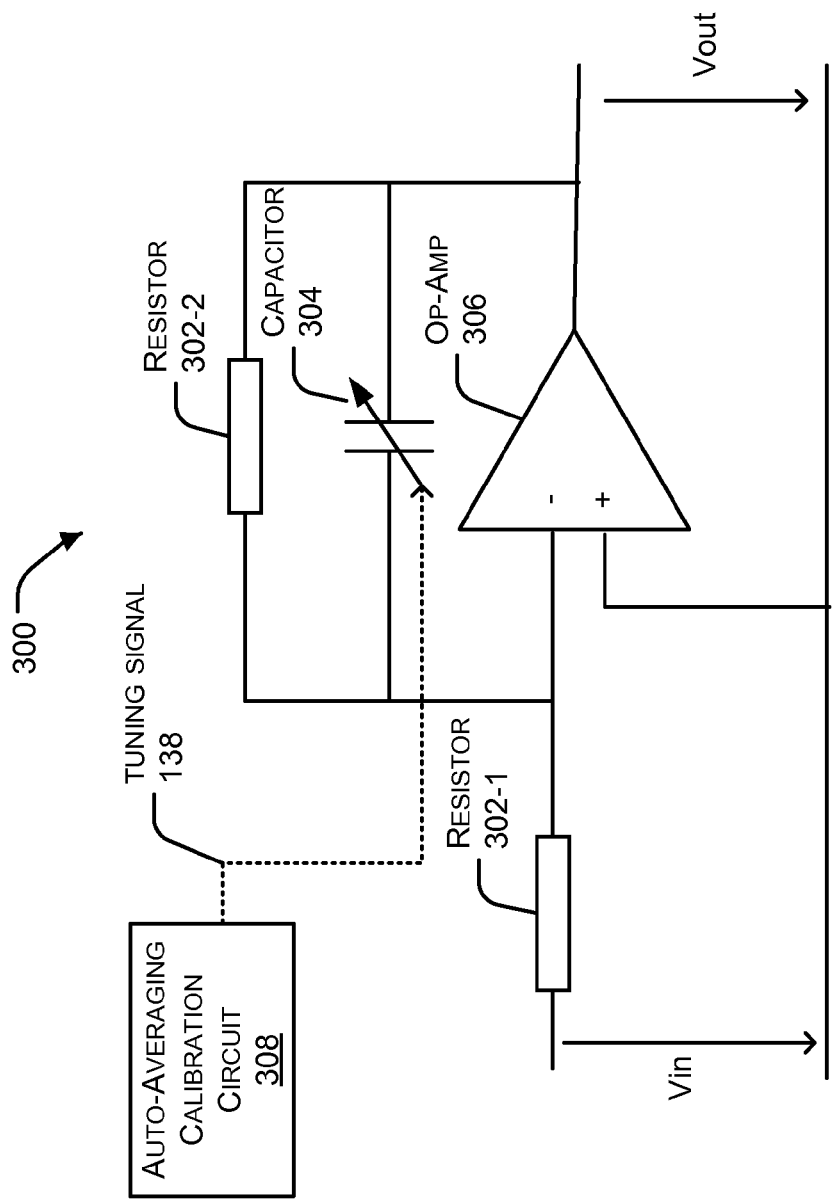
FIG. 3 is a block diagram illustrating an exemplary system that includes an analog circuit employing an auto-averaging RC time constant calibration circuit.

FIG. 3 illustrates an exemplary system 300 in which an analog or RC circuit employs the proposed calibration circuit. For example, the analog circuit can be a low-pass RC filter circuit. The filter circuit includes resistors 302-1, 302-2, a tunable capacitor 304, and an operational amplifier (op-amp) 306. Both the resistors 302-1 and 302-2, and the capacitor 304 can exhibit large variations in their electrical parameters, causing cut-off frequency behavior variations of the exemplary low-pass RC filter; these variations can also occur due to variations in die temperature and supply voltage. To compensate for such cut-off frequency behavior variations, an auto-averaging calibration circuit 308 can be employed.

The auto-averaging calibration circuit 308 provides for automated calibration of RC time constants. In an implementation, the auto-averaging calibration circuit 308 includes components such as resistors, tunable capacitors, comparators, controllers, etc. The resistors and the capacitors in the auto-averaging calibration circuit 308 are matched with the resistors and capacitors, and as example are present in a low-pass filter. This combination ensures that RC time constants and the frequency-dependent behavior of both the circuits are proportional at least up to inevitable errors due to component mismatch and process gradients.

The low-pass filter of system 300 can tune the capacitor 304 to a particular value as determined by the auto-averaging calibration circuit 308. As discussed below in further detail, the auto-averaging calibration circuit 308 includes two capacitor branches. The two capacitors on separate capacitor branches can be tuned to a particular value and then charged alternately one after the other. A value of the RC time constant can be measured for each charging cycle. Both of the capacitors undergo a pre-specified number of charging cycles. One measurement cycle can include any number of charging cycles and corresponding values of RC time constant can be obtained. A final value of the RC time constant can be determined by averaging all the values of the RC time constant obtained. The measurement cycle can be repeated with different tuning values of the capacitors until the measured interval best fits a given reference interval.

Commutation of the charging process between the two capacitor branches helps achieve a higher dU/dt of the charging process. In addition, an increased accuracy of the time constant measurement is obtained due to multiple consecutive charging cycles instead of just one per measurement cycle. Moreover, the auto-averaging property reduces the influence of noise and hum in the reference voltage branch by a factor equal to 1/N, where N is the number of charging cycles.

Figure 4:
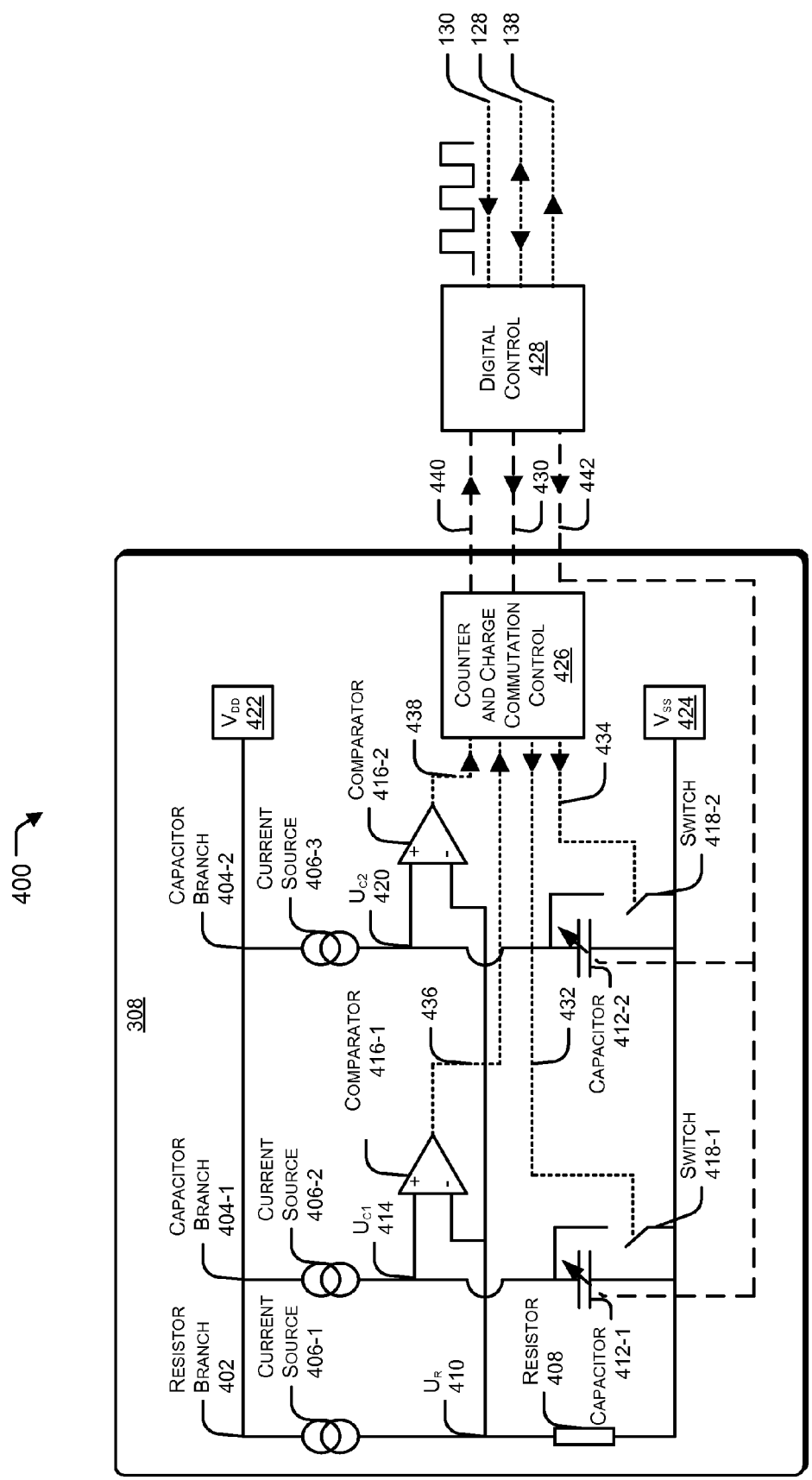
FIG. 4 is a block diagram illustrating an exemplary auto-averaging RC time constant calibration circuit with two capacitor branches.

FIG. 4 illustrates an exemplary system 400 for auto-averaging RC time constant calibration. The system 400 can be fabricated on a chip using semiconductor technology. The system 400 includes the auto-averaging calibration circuit 308. In this example, the auto-averaging calibration circuit 308 includes a resistor branch 402 and two capacitor branches 404-1 and 404-2.

The resistor branch 402 and the capacitor branches 404-1 and 404-2 include current sources 406-1, 406-2, and 406-3 respectively. The current sources 406-1, 406-2, and 406-3 can have any standard implementation and characteristics known in the art. The resistor branch 402 further includes a resistor 408. In an implementation, the resistor 408 can be a unit resistor. The current source 406-1 supplies current to the resistor 408 to induce a reference voltage $U_R$ 410 across it. The reference voltage $U_R$ 410 can be fixed at a constant pre-determined value throughout the operation of the calibration circuit 308.

Each capacitor branch 404 includes tunable capacitors 412. In an implementation, the capacitors 412 are unit capacitors having values in the sub-pF range. Current sources 406 supply current to the capacitors 412. Each capacitor branch 404 also includes comparators 416 that can be implemented using op-amps or other techniques known in the art. Each capacitor branch 404 further includes switches 418. $U_{C1}$ 414 represents the voltage across the capacitor 412-1 and $U_{C2}$ 420 represents the voltage across the capacitor 412-2. $V_{DD}$ 422 and $V_{SS}$ 424 supply voltage for the functioning of the calibration circuit 308.

In the capacitor branch 404-1, the comparator 416-1 compares the voltage $U_{C1}$ 414 fed at its positive input, with the reference voltage $U_R$ 410 fed at its negative input. In the capacitor branch 404-2, the comparator 416-2 compares the voltage $U_{C2}$ 420 fed at its positive input, with the reference voltage $U_R$ 410 fed at its negative input.

The calibration circuit 308 includes a counter and charge commutation control 426 that provides control and signaling to the calibration circuit 308. The counter and charge commutation control 426 can include logical circuitry with AND gates, OR gates, XOR gates, etc. The counter in the counter and charge commutation control 426 keeps track of the number of charging cycles in one measurement cycle. The charge commutation control in the counter and charge commutation control 426 ascertains that subsequent charging processes are strung together temporally without any errors caused by residual charges. The capacitor 412-1 is allowed to be fully discharged, while the capacitor 412-2 is being charged and vice-versa.

The counter and charge commutation control 426 communicates with a digital control 428. In an implementation, the digital control 428 can have digital components designed using VHDL coding (Very-High-Speed Integrated Circuits Hardware Description Language). The digital control 428 controls the operation of the calibration circuit 308 by providing external signals. The digital control 428 can also act as an interface between the calibration circuit 308 and the circuit that is to be calibrated. In an implementation, the digital control is part of a processing sub-system of a device or apparatus that includes system 400.

When the voltage supply $V_{DD}$ 422 and $V_{SS}$ 424 energize the calibration circuit 308, the current source 406-1 supplies constant current to the resistor 408. This generates the reference voltage $U_R$ 410 across the resistor 408, which in turn feeds the negative input of the comparators 416-1 and 416-2.

The switches 418-1 and 418-2 remain closed initially to keep the voltages $U_{C1}$ 414 and $U_{C2}$ 420 at zero volts prior to a measurement cycle in order to eliminate the influence of residual capacitor charge on the measurement result. The measurement cycle starts when the digital control 428 signals a low value on the discharge signal 430; after this event the digital control 428 starts to count reference clock cycles 130 until later on, the completion of a whole measurement cycled is signaled by comparator signal 440.

On receiving a low value on a discharge signal 430 from the digital control 428, the counter and charge commutation control 426 activates local discharge signals 432 and 434 to the switches 418-1 and 418-2, respectively. The local discharge signal 432 causes the switch 418-1 to open while the switch 418-2 remains closed. While the switch 418-1 is open, current flows through the capacitor 412-1 via the current source 406-2. The capacitor 412-1 gets charged, thus increasing the voltage across the capacitor, $U_{C1}$ 414, linearly with time. The comparator 416-1 continuously compares the voltage $U_{C1}$ 414 with the reference voltage $U_R$ 410. As soon as the voltage $U_{C1}$ 414 becomes equal to the reference voltage $U_R$ 410, the comparator 416-1 sends a local comparator signal 436 to the counter and charge commutation control 426.

The counter and the charge commutation control 426 determines the time interval elapsed between the opening of the switch 418-1 and the receipt of the local comparator signal 436. The counter and the charge commutation control 426 immediately sends the local discharge signal 432 to close the switch 418-1, thereby initiating the discharge of the capacitor 412-1. At the same time, the counter and charge commutation control 426 sends the local discharge signal 434 to open the switch 418-2. It is to be noted that the counter and the charge commutation control 426 does not employ a clock and thus asynchronously provides commutation of charging process.

While the switch 418-2 is open, current flows through the capacitor 412-2 via the current source 406-3. The capacitor 412-2 gets charged, thus increasing the voltage across the capacitor, $U_{C2}$ 420, linearly with time. The comparator 416-2 continuously compares the voltage $U_{C2}$ 420 with the reference voltage $U_R$ 410. As soon as the voltage $U_{C2}$ 420 becomes equal to the reference voltage $U_R$ 410, the comparator 416-2 sends a local comparator signal 438 to the counter and charge commutation control 426.

The counter and charge commutation control 426 may also check whether the number of charging cycles completed is equal to a pre-specified number of charging cycles or not. According to one implementation, the counter in the counter and charge commutation control 426 increments a count by one, each time a charging cycle is completed. The counter keeps comparing the counter value with the pre-specified number of charging cycles. In case the count is less than the pre-specified number of charging cycles, the whole process described above repeats and alternate charging-discharging of the capacitors 412-1 and 412-2 continues. When the pre-specified number of charging cycles is completed, the counter and charge commutation control 426 sends a comparator signal 440 to the digital control 428. The digital control 428 has, in the meantime, since a low value was signaled on the discharge signal 430, been counting reference clock cycles 130 of known duration. The comparator signal 440 inhibits this reference clock cycle counter on receipt of the comparator signal 440; thus, the final counter value represents the average time constant.

The digital control 428 checks if the time constant is equal to the given target value. If not, the digital control 428 sends a capacitor tuning signal 442 to both the capacitors 412-1 and 412-2. The capacitor tuning signal 442 tunes both the capacitors 412-1 and 412-2 to a different value. Thereafter, the calibration circuit 308 determines a new time constant by running a new measurement cycle. The process stops when the digital control 428 determines a value of the time constant sufficiently close to the given target value based on a pre-defined tolerance value of the time constant.

Exemplary Timing Diagram

Figure 5:
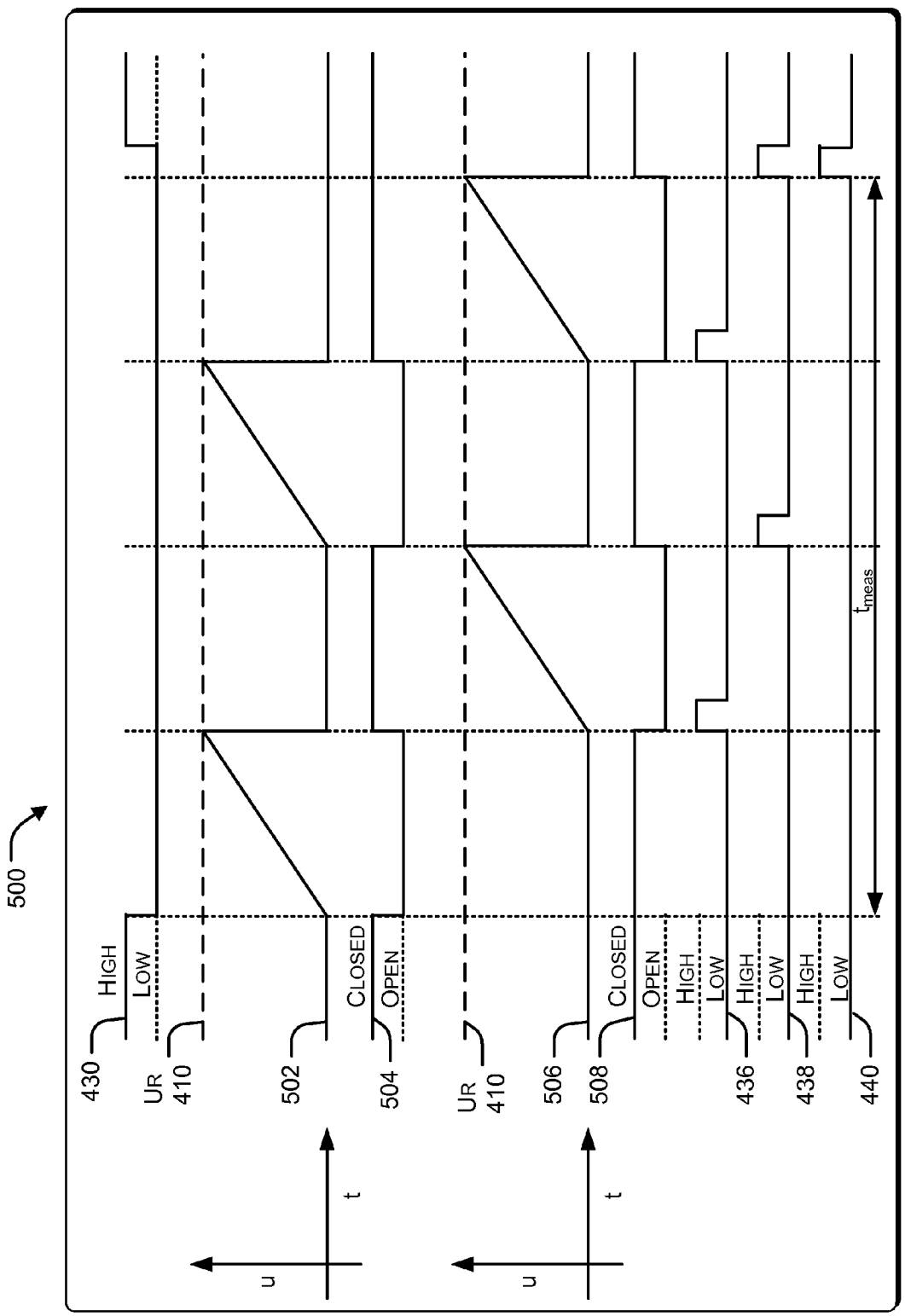
FIG. 5 is a chart illustrating an exemplary timing diagram for an auto-averaging RC time constant calibration circuit with two capacitor branches.

FIG. 5 illustrates an exemplary timing diagram 500 for a system using auto-averaging RC time constant calibration. The timing diagram 500 represents operation of the system 400 for four charging cycles (i.e., N=4, where N is the number of charging cycles). Therefore, in this example, one measurement cycle includes four charging cycles.

The digital control 428 sets the state of the discharge signal 430 either high (1) or low (0). The reference voltage $U_R$ 410 is represented by a straight line, since the reference voltage $U_R$ 410 remains fixed at a constant value throughout the measurement cycle. Line 502 represents the state of the capacitor voltage $U_{C1}$ 414 varying with time. Line 504 represents the state of the switch 418-1 as dictated by the local discharge signal 432. Line 506 represents the state of the capacitor voltage $U_{C2}$ 420 varying with time. Line 508 represents the state of the switch 418-2 as dictated by the local discharge signal 434. The local comparator signal 436 can be in a low or a high state as dictated by the The local comparator signal 438 can also be in a low or a high state as dictated by the output of the comparator 416-2 based on a comparison of the voltage values 410 and 506. The state of the comparator signal 440 can be high or low as per the local comparator signals 436 and 438.

The operation of the calibration circuit 308 begins when the digital control 428 sets the state of the discharge signal 430 from high to low state. At this point, the local discharge signal 432 opens the switch 418-1, thereby making the state 504 go low from high. As soon as the state 504 goes low, the state of the capacitor voltage $U_{C1}$ 414 changes and rises linearly with time from low to a high value equal to the reference voltage $U_R$ 410. When the value of $U_{C1}$ 414 equals $U_R$ 410, the local comparator signal 436 goes from low to high momentarily to inform the counter and charge commutation control 426 about completion of one charging cycle.

In response, the counter and charge commutation control 426 closes the switch 418-1 making the state 504 go high, thereby discharging the capacitor 412-1 rapidly, as shown by 502.

Additionally, the counter and charge commutation control 426 sends the local discharge signal 434, which opens the switch 418-2 making the state 508 go low from high. As soon as the state 508 goes low, the state 506 of the capacitor voltage $U_{C2}$ 420 changes and rises linearly with time from low to a high value equal to the reference voltage $U_R$ 410. When the value of $U_{C2}$ 420 equals $U_R$ 410, the local comparator signal 438 goes from low to high momentarily to inform the counter and charge commutation control 426 about completion of the second charging cycle. In response, the counter and charge commutation control 426 closes the switch 418-2 making the state 508 go high, thereby discharging the capacitor 412-2 rapidly, as shown by line 506. Additionally, the counter and charge commutation control 426 sends the local discharge signal 432, which opens the switch 418-1 making the state 504 go low from high again.

This continues for next two charging cycles. After the completion of all four charging cycles, the counter and charge commutation control 426 makes the state of the comparator signal 440 high from low momentarily marking the completion of one measurement cycle. The comparator signal 440 represents the averaged time constant in terms of a time difference between the high-to-low transition of discharge signal 430 and low-to-high transition of comparator signal 440. On receipt of the comparator signal 440, the digital control 428 inhibits the counting of reference clock cycles.

Exemplary Method

Figure 6:
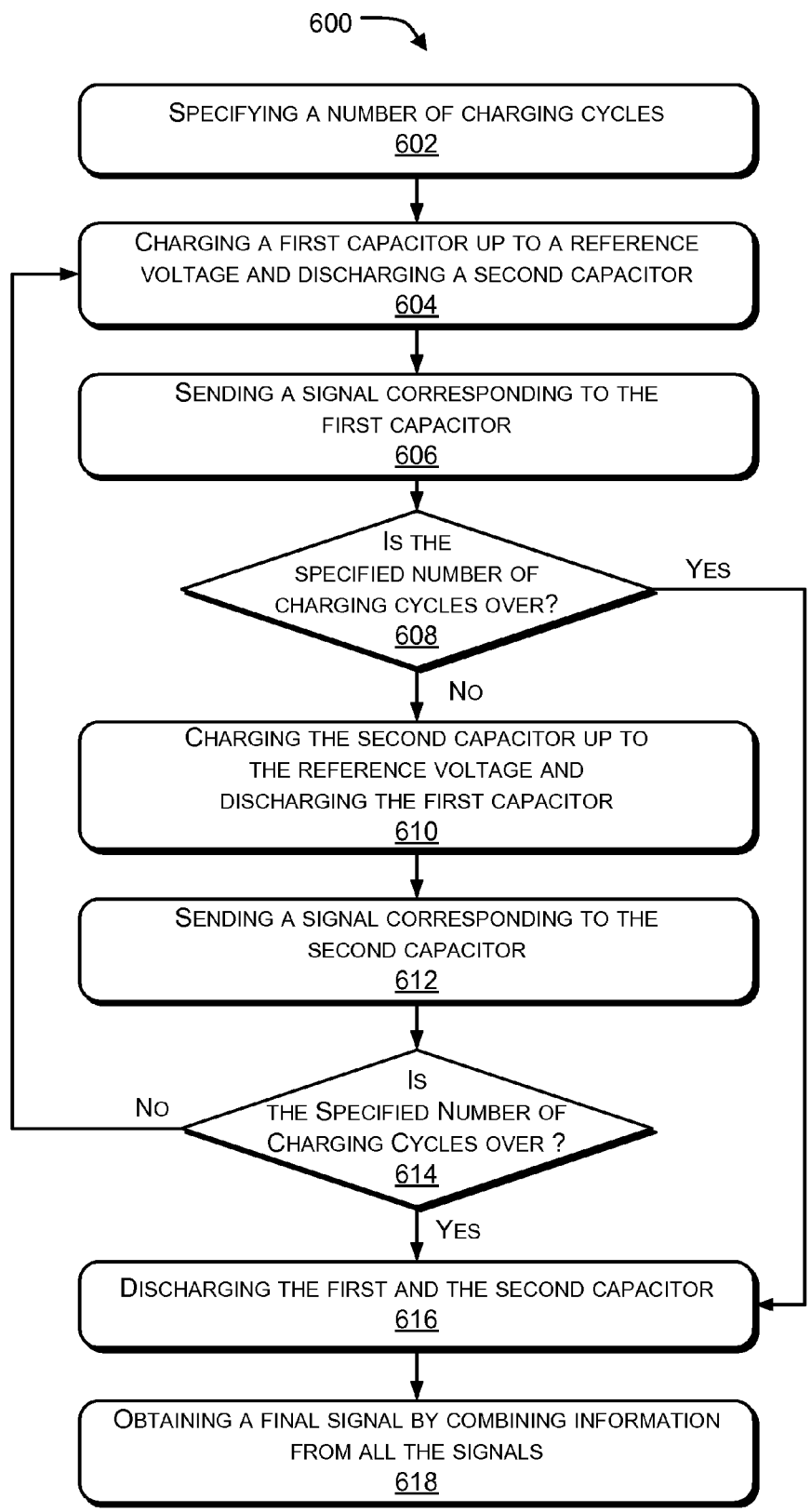
FIG. 6 is a flow chart illustrating an exemplary process for auto-averaging RC time constant calibration.

FIG. 6 illustrates an exemplary process 600 for implementing auto-averaging RC time constant calibration. The order in which the method is described is not intended to be construed as a limitation, and any number of the described method blocks can be combined in any order to implement the method, or alternate method. Additionally, individual blocks may be deleted from the method without departing from the spirit and scope of the subject matter described herein. Furthermore, the method can be implemented in any suitable hardware, software, firmware, or a combination thereof, without departing from the scope of the invention.

At block 602, a number of charging cycles can be specified. Depending upon the requirement, the number of charging cycles to be included in one measurement cycle can be pre-specified. Any number of charging cycles can be included in one measurement cycle for determining the RC time constant. For example, one charging cycle corresponds to the time interval elapsed between opening of switch 418-1, and increasing the capacitor voltage $U_{C1}$ 414 to reference voltage $U_R$ 410. In an implementation, the capacitors 412-1 and 412-2 can undergo any number of charging cycles.

At block 604, a first capacitor can be charged up to a reference voltage and a second capacitor can be discharged. For example, before the first charging cycle, the switches 418-1 and 418-2 are in a closed state, continuously discharging the capacitors 412-1 and 412-2 respectively and keeping them at zero volts. When switch 418-1 opens, the capacitor 412-1 charges and the voltage across the capacitor, $U_{C1}$ 414 increases linearly with time. For example, the comparator 416-1 compares the voltage $U_{C1}$ 414 with the reference voltage $U_R$ 410 continuously, and causes the capacitor 412-1 to stop charging once the voltage $U_{C1}$ 414 reaches the reference voltage $U_R$ 410. The capacitors are tunable, and can be tuned to a suitable value corresponding to a given target frequency value.

At block 606, a signal corresponding to the first capacitor can be sent. For example, once the capacitor voltage $U_{C1}$ 414 becomes equal to the reference voltage $U_R$ 410, the comparator 416-1 sends the local comparator signal 436 to the counter and charge commutation control 426. The counter and charge commutation control 426 determines and stores the time constant by measuring the time interval for which the charging cycle of the capacitor 412-1 lasted, and also counts the number of charging cycles completed.

At block 608, a check may be performed as to whether the specified number of charging cycles has been completed. In an implementation, the counter in the counter and charge commutation control 426 keeps track of the number of charging cycles completed. If the specified number of charging cycles are over (i.e., following the YES branch block 608), the instructions at block 616 are processed, which are described later. If the specified number of charging cycles is not yet completed (i.e., following the NO branch block 608), the instructions at block 610 are processed.

At block 610, the second capacitor can be charged up to the reference voltage and the first capacitor can be discharged. For example, when the switch 418-2 opens, the capacitor 412-2 charges and the voltage $U_{C2}$ 420 increases linearly with time. The comparator 416-2 compares the voltage $U_{C2}$ 420 with the reference voltage $U_R$ 410 continuously and causes the capacitor 412-2 to stop charging once the voltage $U_{C2}$ 420 reaches the reference voltage $U_R$ 410. At the same time, the switch 418-1 closes, discharging the capacitor 412-1 rapidly and making the voltage $U_{C1}$ 414 equal to zero volts.

At block 612, a signal corresponding to the second capacitor can be sent. For example, once the capacitor voltage $U_{C2}$ 420 becomes equal to the reference voltage $U_R$ 410, the comparator 416-2 sends the local comparator signal 438 to the counter and charge commutation control 426. The counter and charge commutation control 426 determines and stores the time constant by measuring the time interval for which the charging cycle of the capacitor 412-2 lasted, and also counts the number of charging cycles completed.

At block 614, a check may be performed as to whether the specified number of charging cycles has been completed. In an implementation, the counter in the counter and charge commutation control 426 keeps track of the number of charging cycles completed. If the specified number of charging cycles have been completed (i.e., following the YES branch block 614), the instructions at block 616 are processed, which are described later. If the specified number of charging cycles is not yet completed (i.e., following the NO branch block 614), the instructions through block 604 to block 614 are processed again.

At block 616, after the completion of the specified number of charging cycles, both the capacitors are discharged completely. In an implementation, the switches 418-1 and 418-2 are closed, thereby discharging both the capacitors 412-1 and 412-2. As the capacitors 412-1 and 412-2 discharge, the voltages $U_{C1}$ 414 and $U_{C2}$ 420 drop rapidly and decrease down to zero volts.

At block 618, a final signal can be obtained by combining information from all signals. According to one implementation, the counter and the commutation control 426 combines the local comparator signals 436 and 438 to obtain the comparator signal 440. The counter and the charge commutation control 426 then sends the comparator signal 440, which represents the averaged value of the time constant, to the digital control 428. By averaging the results obtained from the pre-defined charging cycles, a final time constant can be determined. Then, the capacitors in the analog circuit (i.e., the IC) to be adjusted or calibrated, can also be tuned to the particular tuning value obtained, thus providing a RC time constant corresponding to the desired cut-off frequency.

CONCLUSION

For the purposes of this disclosure and the claims that follow, the terms "coupled" and "connected" have been used to describe how various elements interface. Such described interfacing of various elements may be either direct or indirect. Although embodiments for auto-averaging RC time constant calibration have been described in language specific to structural features and/or methods, it is to be understood that the appended claims are not necessarily limited to the specific features or methods described. Rather, the specific features and methods are disclosed as exemplary implementations for auto-averaging RC time constant calibration.

What is claimed is:

1. A calibration circuit comprising:
   two capacitor branches, wherein each capacitor branch includes a current source, at least one capacitor and a switch;
   a resistor branch connected to the two capacitor branches, that includes a current source that induces a reference voltage and a resistor; and
   a counter and charge commutation control that tracks charging cycles of the capacitors as they are charged and discharged.

2. The calibration circuit of claim 1, wherein the capacitors are tunable capacitors that are tunable to a particular cut-off frequency.

3. The calibration circuit of claim 1, wherein the at least one capacitor of one branch is charged to the reference voltage while the at least one capacitor of the other branch is discharged to zero volts to complete a charging cycle.

4. The calibration circuit of claim 1, wherein the switches are closed before a measurement cycle to eliminate residual charges at the capacitors.

5. The calibration circuit of claim 1, wherein the counter and charge commutation control instructs the switches to open and close for a measure cycle.

6. The calibration circuit of claim 1, wherein a number of charging cycles is predetermined.

7. The calibration circuit of claim 1, wherein the calibration circuit receives from a digital control, different capacitor tuning values to compute different RC time constants.

8. An apparatus comprising:
   a circuit that includes passive RC components; and
   an auto-averaging calibration circuit to calibrate RC time constants for the RC components comprised of:
   a) at least two capacitor branches, wherein each capacitor branch includes a current source, at least one capacitor, and a switch;
   b) a resistor branch connected to the capacitor branches, that includes a current source that induces a reference voltage, and a resistor; and
   c) a counter and commutation control that tracks charging cycles of the capacitors as they are charged and discharged; and
   a digital control that controls the auto-averaging calibration circuit.

9. The apparatus of claim 8, wherein the passive components include capacitors to be tuned to a particular RC time constant.

10. The apparatus of claim 8, wherein the circuit includes capacitors tunable to a particular cut-off frequency.

11. The apparatus of claim 8, wherein the counter and commutation control is asynchronous.

12. The apparatus of claim 8, wherein the counter and charge commutation control computes a final value of measured time constants by taking an average of recorded time constants.

13. The apparatus of claim 8, wherein the counter and commutation control tracks a number of charging cycles completed and compares the completed cycles to a predetermined number of cycles to be completed.

14. The apparatus of claim 8, wherein the digital control checks if an RC time constant is equal to a given target value, and if the RC time constant is not equal to a given target value, the digital control sends a capacitor tuning value to the capacitors.

15. A method for averaging RC time constant calibration in a circuit comprising:
    specifying a number of charging cycles for at least two capacitors in a calibration circuit;
    charging a first capacitor to a reference voltage and discharging a second capacitor, wherein the first and second capacitors are tunable to a value corresponding to a cut-off frequency value for the circuit;
    measuring an RC time constant value of the capacitors after each charging cycle; and
    averaging the measured RC time constant values.

16. The method of claim 15, wherein the number of charging cycles is included in one measurement cycle.

17. The method of claim 15, wherein the circuit is tunable to the cut-off frequency value.

18. The method of claim 15, wherein the measuring the RC time constant values is performed by measuring a time interval for the charging cycle of the capacitors, and counting the number of charging cycles that are completed.

19. The method of claim 15 further comprising tracking a number of cycles completed and determining if the specified number of cycles has been completed.

20. The method of claim 15 further comprising passing the averaged RC time constant values to a control that adjusts the circuit.

* * * * *